United States Patent
Eggers et al.

(10) Patent No.: US 7,482,644 B2
(45) Date of Patent: Jan. 27, 2009

(54) INTEGRATED SEMICONDUCTOR MEMORY AND METHOD FOR ELECTRICALLY STRESSING AN INTEGRATED SEMICONDUCTOR MEMORY

(75) Inventors: Georg Erhard Eggers, München (DE); Stephan Schröder, München (DE); Manfred Pröll, Dorfen (DE); Herbert Benzinger, München (DE)

(73) Assignee: Infineon Technologies AG, Munich (DE)

( * ) Notice: Subject to any disclaimer, the term of this patent is extended or adjusted under 35 U.S.C. 154(b) by 240 days.

(21) Appl. No.: 11/061,087

(22) Filed: Feb. 18, 2005

(65) Prior Publication Data

US 2005/0194614 A1 Sep. 8, 2005

(30) Foreign Application Priority Data

Feb. 19, 2004 (DE) .................. 10 2004 008 245

(51) Int. Cl.
*H01L 29/73* (2006.01)
(52) U.S. Cl. .................. 257/208; 257/208; 257/211; 257/202; 257/209; 257/368
(58) Field of Classification Search .................. 365/231; 257/315, 208, 211
See application file for complete search history.

(56) References Cited

U.S. PATENT DOCUMENTS

| | | | | |
|---|---|---|---|---|
| 4,827,449 A | * | 5/1989 | Inoue | 365/63 |
| 5,313,432 A | * | 5/1994 | Lin et al. | 365/185.06 |
| 5,825,683 A | * | 10/1998 | Chang | 365/104 |
| 6,081,474 A | * | 6/2000 | Togami et al. | 365/230.03 |
| 6,114,861 A | * | 9/2000 | Takeo | 324/658 |
| 6,891,742 B2 | * | 5/2005 | Takano et al. | 365/145 |
| 2003/0126529 A1 | | 7/2003 | Cho | |

FOREIGN PATENT DOCUMENTS

DE    100 46 012 A1    4/2002

* cited by examiner

*Primary Examiner*—Zandra Smith
*Assistant Examiner*—Tsz K Chiu
(74) *Attorney, Agent, or Firm*—Slater & Matsil, L.L.P.

(57) ABSTRACT

Semiconductor memories (1) have segmented word lines (5a, 5b), which in each case have a main word line (10a, 10b) made of a conductive metal and a plurality of interconnect segments (15a, 15b) coupled to the main word line (10a, 10b), which are coupled to the respective main word line (10a, 10b) in each case via at least one contact hole filling (11). If one of the contact hole fillings (11) is defective or at high resistance then functional errors of the semiconductor memory occur. The interconnect segments (15a, 15b) of two respective word lines (5a, 5b) can be short-circuited in pairs with the aid of switching units (20), whereby a static current (I) that flows via the contact hole fillings (11) can be used for electrically stressing the contact hole fillings (11). Electrical stressing of contact hole fillings of segmented word lines is thus made possible.

14 Claims, 8 Drawing Sheets

FIG 12

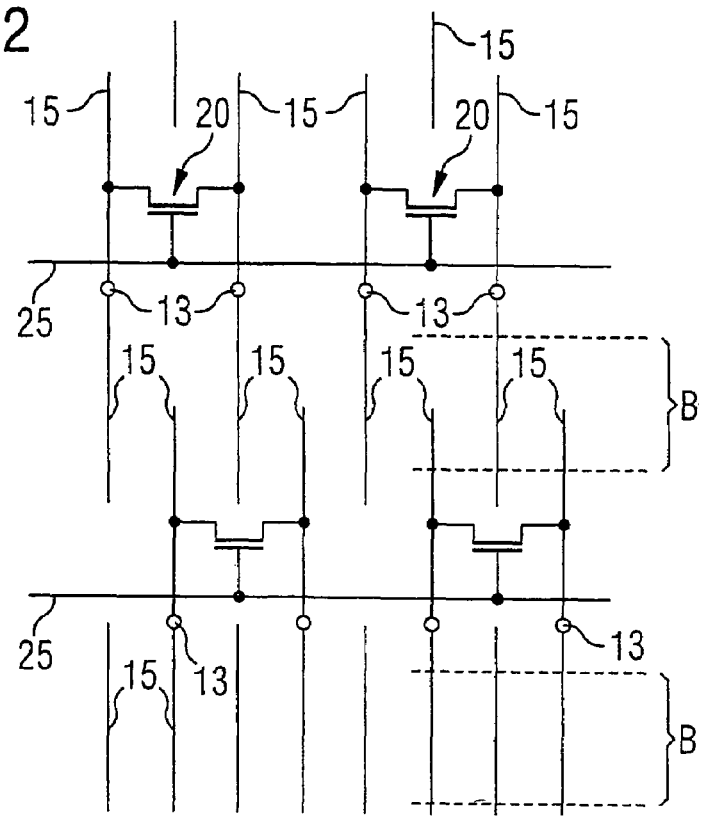

FIG 13 testwise electrical biasing of a first, active word line 5a by application of a first potential V1 during a time duration from t = 0 to t = T

short-circuiting of a first interconnect segment 15a of the first word line 5a with an interconnect segment 15b of a second word line 5b by switching of a switching unit 20

carrying out a voltage measurement between the first word line 5a and the second word line 5b

indication of a defective contact filling if a measured voltage V between the first 5a and the second word line 5b is less than the difference between the first potential V1 and a potential V0 of the second word line 5b though 2004, and
INTEGRATED SEMICONDUCTOR MEMORY AND METHOD FOR ELECTRICALLY STRESSING AN INTEGRATED SEMICONDUCTOR MEMORY This application claims priority to German Patent Application 10 2004 008 245.6, which was filed Feb. 19, 2004, and is incorporated herein by reference.

TECHNICAL FIELD

The invention relates to an integrated semiconductor memory. The invention furthermore relates to a method for electrically stressing an integrated semiconductor memory.

BACKGROUND

Integrated semiconductor memories have word lines and memory cells with selection transistors whose gate electrodes are connected by the word lines. There are semiconductor memories in which each word line has a longer main word line and many shorter line segments, each interconnect segment being connected to the respective main word line via at least one contact hole filling.

After fabrication, integrated semiconductor memories are subjected to an electrical functional test, during which the entirely satisfactory functioning of the semiconductor memory is checked. In particular the high density of miniaturized component structures requires such tests since chip failures may arise even on account of small positional deviations of microelectronic structures. Temporal alterations in the structures themselves can also have the effect that over the course of time, by way of example, originally conductive structures acquire high resistance and a current flow is thereby made more difficult or interrupted. Such alterations may be caused by electromigration or other effects.

In order to prevent ageing-dictated defects of semiconductor memories, semiconductor memories are subjected to a burn-in test after they have been produced, during which test they are stressed, i.e., loaded thermally and/or electrically to a greater extent than in the later customary operational mode. Ageing-dictated alterations are thereby accelerated and defective semiconductor chips are sorted out prior to delivery to customers. Those semiconductor memories which pass the burn-in test are less susceptible to ageing-dictated failure.

A burn-in test achieves higher loading of a semiconductor memory by virtue of the semiconductor memory being operated at an excessively increased temperature and with an excessively increased internal operating voltage. During the artificial pre-aging, a saturation behavior occurs in the frequency of defects that occur, so that after saturation has been reached, the failure probability of the semiconductor memories that have not yet failed is relatively low.

Devices for carrying out a burn-in test have a multiplicity of terminals to which a multiplicity of semiconductor memories are connected simultaneously. The clock frequency of the burn-in systems operating in parallel is limited on account of the multiplicity of terminals and the simultaneously tested semiconductor memories and is of the order of magnitude of approximately 5 to 10 MHz. Such component structures of a semiconductor memory which, in normal operation of the memory, are operated with significantly higher switching times of 100 MHz or higher cannot be switched in accelerated fashion by means of burn-in systems. For contact hole fillings, in particular, hitherto there has been no possibility for artificially pre-aging them. However, on account of their small lateral dimensions, contact hole fillings produce no or only a poor conductive electrical connection even in the event of small positional errors. Contact holes are used for word lines, for example, by means of which memory cells are accessed during operation of the memory, for instance when storing, reading out or when refreshing information. Word lines often comprise metallic interconnects, referred to here as main word lines, and a multiplicity of interconnect segments, which are in each case electrically conductively connected to the main word line by a contact hole. Each interconnect segment forms the gate electrodes of a plurality of selection transistors.

In the case of a segmented word line, the selection transistors are in each case connected to the main word line by the interconnect segments. The main word line generally comprises a metal. The interconnect segments usually comprise polysilicon. On account of the polycrystalline structure of polysilicon, particularly in the case of high switching times, the signal propagation is not effected rapidly enough and is attenuated as the length of the polysilicon line increases. Therefore, only relatively short interconnect lengths in each case are produced by segments made of polysilicon, the metallic main word line, which exhibits better conductivity, being provided in a higher metal plane, polysilicon interconnects in each case being connected to the main word line via a contact hole filling. The metallic main word line extends over larger distances than the individual interconnect segments.

On account of the close distance between the word lines, which in each case corresponds only to the minimum feature size of the technology used, the contact hole fillings cannot be produced wider than in accordance with the minimum feature size. A burn-in test stressing the contact hole fillings between the main word line and the interconnect segments of a word line would have to reverse the charge of the capacitance of a low-resistance interconnect segment for the purpose of switching and for the purpose of obtaining a current flow through the contact hole filling. The time duration required for this means that it is not possible to carry out a burn-in test in which the ageing process of contact holes is accelerated relative to normal operation of the memory.

SUMMARY OF THE INVENTION

In one aspect, the present invention enables an accelerated artificial pre-aging of contact hole fillings in semiconductor memories, in particular a pre-aging of contact hole fillings between a main word line and an interconnect segment of a segmented word line.

The preferred embodiment of the invention provides an integrated semiconductor memory, having word lines and memory cells with selection transistors, each selection transistor having a gate electrode connected by a word line, each word line having a main word line and a plurality of interconnect segments connected to the main word line, each interconnect segment being connected to the respective main word line via at least one contact hole filling, and the semiconductor memory having at least one switching unit, by means of which an interconnect segment of a first word line can be short-circuited with an interconnect segment of a second word line.

The preferred embodiment of the invention enables an accelerated burn-in test of contact holes within segmented word lines by means of a novel circuit construction of a semiconductor memory. The semiconductor memory according to the invention has a switching element which, in a conducting switching state, short-circuits two interconnect segments of different word lines with one another. Such short-circuiting is undesirable in the case of a conventional semiconductor memory and would lead to erroneous switching processes during normal operation since, for selectively addressing memory cells via the word lines and bit lines, these lines are not permitted to be directly electrically interconnected at all, unless a plurality of lines are simultaneously biased with a second potential. As soon as individual lines are selected, however, i.e. electrically biased with an altered potential relative to the second potential, it is necessary to ensure a unique assignment of each memory cell to a word line and a specific bit line.

Embodiments of the invention make it possible, by short-circuiting two word lines in pairs, for test purposes during a burn-in test, to open a current path that runs via contact hole fillings of word lines. A contact hole filling that has acquired high resistance reduces the magnitude of a short-circuit current. A voltage drop between two word lines that are short-circuited with one another by means of the switching unit provided according to the invention thus indicates a defective contact hole filling. This means that contact hole fillings can therefore be stressed without the charge reversal of entire word line segments that is conventionally required.

According to embodiments of the invention, the word lines are connected up to one another in pairs, i.e. in groups of two, in the region of a specific interconnect segment of the gate plane, thereby enabling a current flow from a first to a second word line. The current flow here runs in each case via an interconnect segment of the first word line and an interconnect segment of the second word line. This embodiment makes use of the fact that, during operation of a semiconductor memory, the word lines can be electrically biased individually and there is then an electrical potential difference between different word lines. The potential difference is utilized for the first time according to the invention in order to electrically stress contact hole fillings provided in segmented word lines. Between the word lines that are short-circuited with one another, a static current can be generated, which loads the contact hole fillings much faster than current pulses used in conventional burn-in tests. The switching units according to the invention enable all the interconnect segments of two individual word lines to be short-circuited with one another in pairs, only two interconnect segments ever being simultaneously short-circuited with one another in order that the contact hole fillings situated at these two interconnect segments are stressed in a targeted manner. Depending on which of the switching units is switched in a conducting state in testwise fashion, an arbitrary interconnect segment of one of the first word lines can be short-circuited with a corresponding interconnect segment of a second word line. The semiconductor memory according to the invention opens up new possibilities for artificially pre-aging contact hole fillings within word lines.

It is preferably provided that the interconnect segments of two respective word lines can be short-circuited with one another in pairs by means of a respective switching unit. The interconnect segments of two word lines are in each case connected up to one another in pairs, so that, along the course of the main word lines, in the region of each interconnect segment, each interconnect segment of a first word line can be short-circuited with an interconnect segment of a second word line by means of a switching unit.

It is preferably provided that the interconnect segments of a respective word line can be short-circuited with interconnect segments of the respective next word line by means of the switching units. Short-circuiting with the respective nearest, i.e., directly adjacent, word line is also conceivable, but word lines are usually arranged such that the word line segments of adjacent word lines are arranged offset with respect to one another by half a segment length in the direction of the word line course. Short-circuiting with the respective next adjacent word line therefore obviates unnecessarily long connecting lines between the word lines that are respectively to be short-circuited with one another.

It is preferably provided that bit lines of the semiconductor memory are arranged within a plurality of blocks of memory cells, control lines running parallel to the bit lines being provided between the blocks of memory cells and each control line being connected to a plurality of switching units. In this case, a plurality of switching units, which in each case short-circuit two different word lines in the region of a specific interconnect segment, are simultaneously driven in parallel, so that half of all the word lines that can be short-circuited with one another in pairs by means of the switching units connected to the control line can be electrically biased simultaneously in order to accelerate the burn-in test. The control lines are arranged between the bit lines and in a manner running parallel thereto and thus subdivide an otherwise uniform memory cell array into a plurality of blocks within which the memory cells are arranged without reducing the cell density.

One embodiment provides for a respective control line to be arranged between adjacent blocks of memory cells. In view of typical lengths of word line segments that extend over several hundred to a few thousand memory cells, the storage density is not appreciably reduced by the additional control lines.

Another embodiment provides for the interconnect segments to be connected to driver circuits and the driver circuits to be connected to the main word lines. Driver circuits of word line drivers serve for conditioning the word line potentials, which are corrupted by resistive and capacitive influences, after a certain length of the course of the word lines.

It is preferably provided that the driver circuits are connected to a main word line by a respective contact hole filling and to an interconnect segment by a respective further contact hole filling. In this case, two contact hole fillings that are jeopardized by ageing processes are always present per interconnect segment. With the aid of the method according to the invention, they can be electrically stressed simultaneously, so that, as a result of short-circuiting two word lines with one another, a total of four contact hole fillings are simultaneously exposed to a burn-in current.

It is preferably provided that two respective interconnect segments of a word line are connected to the same driver circuit. In this case, each driver circuit is connected to the main word line via an upper contact hole filling. Furthermore, a first and a second word line segment are in each case connected to the driver circuit via a first lower and a second lower contact hole. In the case of this design, the interconnect segments of two word lines that are connected via the first or via the second lower contact holes can optionally be short-circuited with one another in order to stress either only the first or the second contact hole fillings.

An embodiment corresponding to this design provides for a driver circuit and a control line to be in each case arranged between adjacent blocks of memory cells. The control lines which in each case connect a plurality of switching elements according to an embodiment of the invention, in parallel can be arranged without appreciably taking up area in the region of the driver circuits.

It is preferably provided that the switching units are short-circuiting transistors whose two source/drain regions are connected to two interconnect segments of two respective word lines. These additional transistors can in each case short-circuit with one another two word lines that are next adjacent to one another. The ends of the interconnect segments (located between the two word lines) of the word lines located in between can therefore be shortened somewhat, so that they do not quite reach as far as the short-circuiting transistors. The short-circuiting transistors are formed by a gate oxide layer, by doped source/drain regions in the substrate and by a gate electrode in the same way as the selection transistors.

It is preferably provided that two respective word lines can be short-circuited with one another in testwise fashion with the aid of the control lines, a static current being conducted from a first main word line via at least one contact hole filling to a first interconnect segment, from the first interconnect segment via a short-circuiting-switched switching unit to a second interconnect segment, and from the second interconnect segment via at least one further contact hole filling to a second main word line. The current path leads via at least two contact hole fillings that are statically stressed simultaneously. If the interconnect segments are connected to the main word lines via driver circuits, four contact hole fillings are in each case stressed simultaneously for each current path.

It is preferably provided that a respective active word line, in the region of an individual interconnect segment, can be short-circuited with a passive word line by means of the switching elements. In this case, the active word line is biased to an altered potential. In the case of intact contact hole fillings, a short-circuit current flows to the passive word line.

Finally, it is preferably provided that the interconnect segments comprise polysilicon and the main word lines comprise a metal having a higher electrical conductivity than polysilicon. The main word lines may be fabricated from aluminum, tungsten or copper, by way of example.

In other embodiments, the invention provides a method for electrically stressing an integrated semiconductor memory having word lines and memory cells with selection transistors whose gate electrodes are connected to the word lines, each word line having in each case a main word line and a plurality of interconnect segments that are connected to the respective main word line via in each case at least one contact hole filling, and the semiconductor memory having a switching unit, by means of which an interconnect segment of a first word line can be short-circuited with an interconnect segment of a second word line, the method having the following order of steps:

testwise electrical biasing of the first word line;

switching of the switching unit, as a result of which the interconnect segment of the first word line is short-circuited with an interconnect segment of the second word line; and carrying out of a voltage measurement between the first word line and the second word line.

In the case of the burn-in test according to embodiments of the invention for stressing contact hole fillings, a first word line is biased with a different electrical potential than a second word line, so that the voltage difference across the current path opened with the aid of the switching unit can only lead to a current flow if all the contact hole fillings present in the current path have a sufficiently low electrical resistance. As soon as one of the contact hole fillings has acquired high resistance, a sufficiently high current no longer flows from the first to the second word line.

In a preferred embodiment, it is provided that when the voltage measurement reveals that a measured voltage between the first word line and the second word line is less than the difference between a first potential applied to the first word line and a second potential applied to the second word line, the occurrence of a defective contact hole filling is indicated.

A development of the invention provides for the first word line to be electrically biased over a time period corresponding to a multiplicity of clock units in order to electrically stress contact hole fillings in the region of the first word line and the second word line by means of a static current. The use of static currents for stressing semiconductor memories has not been customary hitherto since conventionally memory cells are discharged or charged and the charging process or discharging process is terminated after a short time, which is generally shorter than the time duration of a clock. Therefore, only very momentary currents can be used in conventional burn-in tests, which is why a saturation of the defect frequency that occurs is not achieved until late in the case of the low clock frequencies that are customary in burn-in tests. A significant shortening of the stress time arises with the aid of static currents that can be maintained for as long as desired over a time duration of many clock times.

It is preferably provided that a multiplicity of word lines are electrically biased simultaneously, and in each case precisely one interconnect segment of each biased word line is short-circuited with in each case precisely one interconnect segment of a non-biased further word line. In principle, half of all the word lines of a semiconductor memory can be biased simultaneously, as a result of which a high percentage of all the contact holes of the word lines can be stressed simultaneously. As an alternative, it is also possible for a smaller proportion of all the word lines to be biased simultaneously in order, for instance, to manage with a smaller number of electrical terminals of the burn-in device.

Finally, it is preferably provided that with the aid of a control line that runs in the region of an individual driver circuit and is connected to a multiplicity of switching units, all word lines that have interconnect segments electrically connected to the driver circuit are short-circuited with one another in pairs. In this case, the greatest possible parallelism of the burn-in test is already achieved with the biasing of just a single control line.

BRIEF DESCRIPTION OF THE DRAWINGS

The invention is described below with reference to FIGS. 1 to 13, in which:

FIG. 12 shows a semiconductor memory according to the invention with control lines between blocks of memory cells; and FIG. 13 shows a flow diagram of a method according to the invention for electrically stressing a semiconductor memory.

The following list of reference symbols can be used in conjunction with the figures

| | |
|---|---|
| 1 | Semiconductor memory |
| 2 | Memory cell |
| 3 | Selection transistor |
| 4 | Gate electrode |
| 5 | Word line |
| 5a | First word line |
| 5b | Second word line |
| 6 | Bit line |
| 10 | Main word line |
| 10a | First main word line |
| 10b | Second main word line |
| 11 | Contact hole filling |
| 12 | Driver circuit |
| 13; 13a, 13b | Further contact hole fillings |
| 14a, 14b | Lead |
| 15 | Interconnect segment |
| 15a | First interconnect segment |
| 15b | Second interconnect segment |
| 16 | Gate electrode of the switching unit |
| 17 | Contact hole |
| 18 | Contact hole filling |
| 20 | Switching unit |
| 21 | Source/drain region |
| 25 | Control line |
| AA | Active area |
| B | Block of memory cells |
| I | Current |
| t | Time duration |
| T | Multiplicity of clock times |
| V | Voltage |
| V1 | First potential |
| V0 | Second potential |

DETAILED DESCRIPTION OF ILLUSTRATIVE EMBODIMENTS

Figure 1:
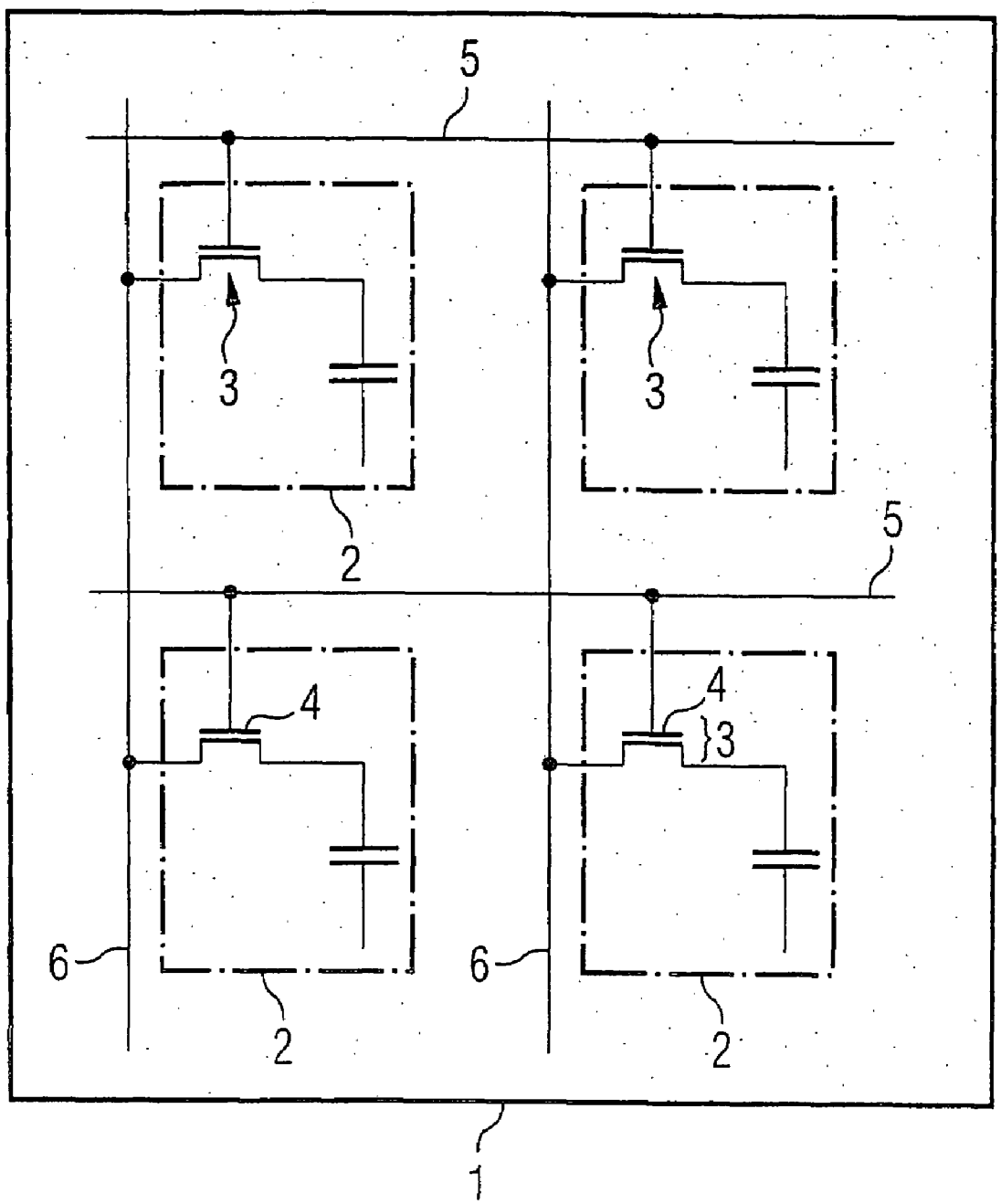
FIG. 1 shows a schematic plan view of a semiconductor memory.

FIG. 1 shows a schematic view of a semiconductor memory 1 with a multiplicity of memory cells 2, the selection transistors 3 of which are connected to bit lines 6 via source/drain terminals and to word lines 5 via gate electrodes 4. Storage capacitors of the memory cells are driven and charged or discharged with the aid of the selection transistors 3. The illustration of the word lines 5 is purely schematic and will be described in more detail below with reference to the further figures of the application.

Figure 2A:
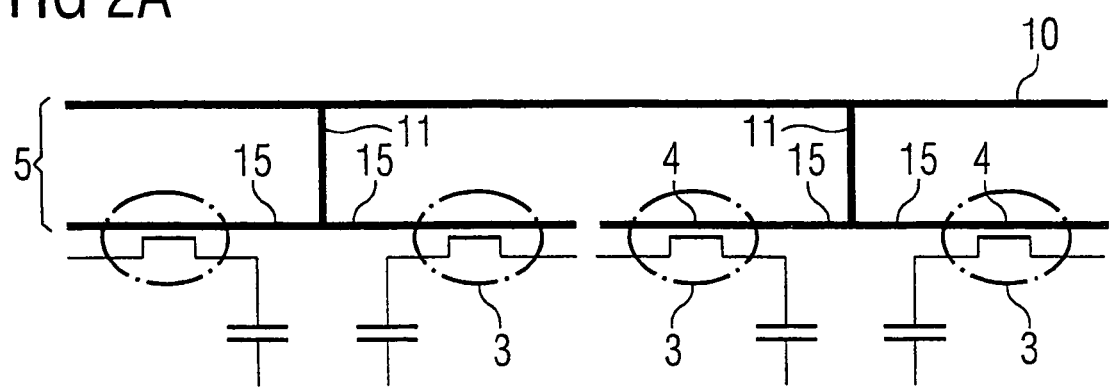
FIGS. 2A and 2B show a cross-sectional view and a plan view of a semiconductor memory with segmented word lines.

FIG. 2A shows a schematic cross-sectional view of the course of a segmented word line 5 having a continuous main word line 10 and a plurality of interconnect segments 15 that are formed segment by segment and run over a shorter distance in comparison with the main word line 10. The interconnect segments 15 are connected to the main word line 10 of the word line 5 by contact hole fillings 11, which are illustrated schematically in FIG. 2A, and are in each case connected to a multiplicity of selection transistors 3, of which they form the gate electrodes 4. For the sake of clarity, only a left-hand and a right-hand selection transistor 3 of a memory cell are respectively illustrated per bit line segment in FIG. 2A; in reality, a few hundred to a few thousand memory cells are connected per word line segment.

Figure 2B:
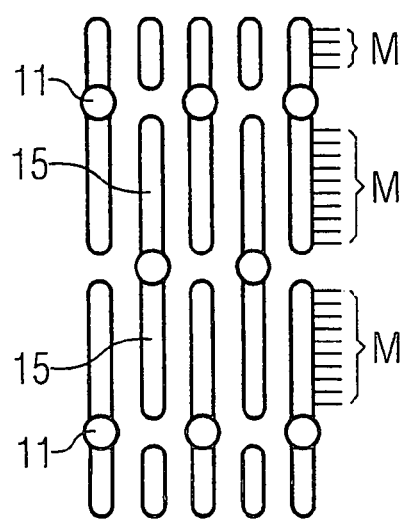

FIG. 2B shows a plan view of a semiconductor circuit with segmented word lines in accordance with FIG. 2A, a plan view at the level of the word line segments 15 being illustrated and the illustration omitting the main word lines 10, located at a higher level, of the total of five word lines illustrated. Interconnect segments 15 extending upward and downward from the contact hole fillings 11 are in each case connected to memory cells. Where next but one adjacent word lines have a contact hole filling 11, which, for reasons appertaining to fabrication technology, are dimensioned such that they are somewhat wider than the interconnect segments 15, the interconnect segments of the intervening word line are shortened.

Figure 3A:
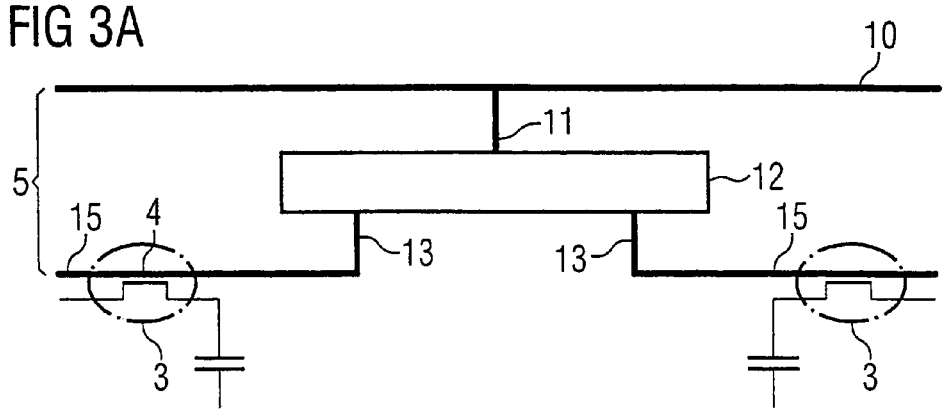
FIGS. 3A and 3B show a cross-sectional view and a plan view of a semiconductor memory with segmented word lines and word line drivers.

FIG. 3A shows a cross-sectional view of a further semiconductor memory with segmented word lines 5, which, in contrast to FIG. 2A, has driver circuits 12 that are used to supply the word line potential at different locations of the word line 5 simultaneously with an unreduced magnitude and thus to prevent a corruption of the applied word potential as the word line length increases. Instead of the interconnect segments 15 from FIG. 2A, in FIG. 3A the driver circuits 12, only one of which is illustrated, are connected to the main word lines 10 by the contact hole fillings 11. The interconnect segments 15, which preferably comprise polysilicon and form the gate electrodes 4 of the selection transistors 3, are connected to a respective side of a driver circuit 12 via further contact hole fillings 13. Consequently, the electrical connection between the main word line 10 and the interconnect segment 15 via the driver circuit 12 can be effected only if both the contact hole filling 11 and the further contact hole filling 13 have low resistance.

Figure 3B:
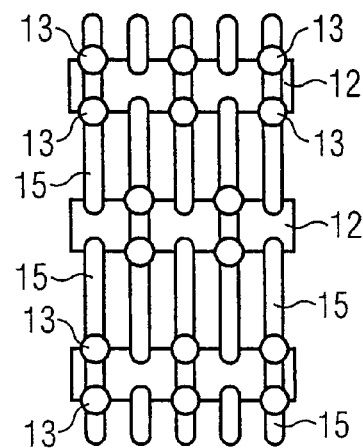

FIG. 3B shows a plan view of the semiconductor memory in accordance with FIG. 3A at the level of the word line segments 15, the driver circuits 12 being arranged at preferably equidistant distances from one another and driving two oppositely arranged interconnect segments in the region of every second word line. Moreover, interconnect segments of adjacent word lines are arranged offset with respect to one another in the same way as in FIG. 2B. The explanation of the invention is based hereinafter on the embodiment of FIGS. 3A and 3B.

Figure 4A:
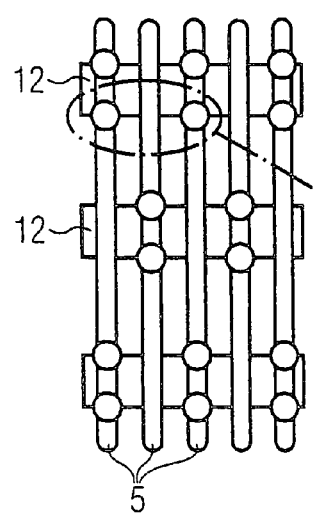
FIGS. 4A and 4B show a plan view and a detail view of a semiconductor memory according to the invention.
Figure 4B:
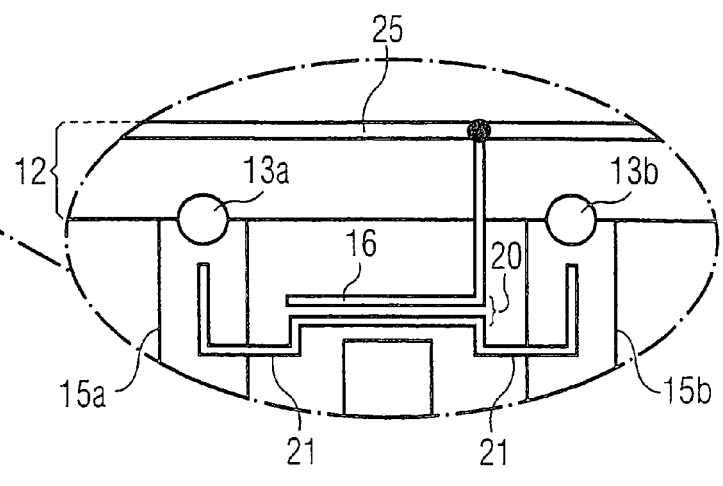

FIGS. 4A and 4B show a simplified plan view and also a detail view therefrom of a semiconductor memory having driver circuits 12, in the region of which are provided leads 25 to switching elements 20 provided according to the invention. FIG. 4A contains an oval contour of the detail view illustrated in FIG. 4B. This detail encompasses a width of three word lines 5. The detail view of FIG. 4B shows two contact holes 13a, 13b at the edge of a driver circuit 12, which contact holes in each case contact-connect a lower word line segment, i.e., an interconnect segment 15A, 15B of the corresponding word line. The word lines that are contact-connected in this way are next but one adjacent word lines between which the just one single further word line is arranged, whose shortened interconnect segment, which is illustrated in the lower region of the oval detail, is contact-connected from the nearest driver circuit. FIG. 4B illustrates, in a schematic illustration, those additional interconnect courses, which are produced from the switching units according to the invention for short-circuiting two respective word lines and also from the control lines for electrically switching the switching units. The illustration shows a single switching unit 20, preferably a short-circuiting transistor fabricated in a MOSFET design, the two source/drain regions 21 of which are arranged in the semiconductor substrate and are electrically connected to one another by the short-circuiting transistor being switched into a conducting state. The gate electrode 16 of the short-circuiting transistor is connected to a control line 25, which in each case connects further switching units 20 in the region of the lower edge of the driver circuit 12 in order to cause these switching units to short-circuit two respective word lines simultaneously and in parallel.

Figure 5:
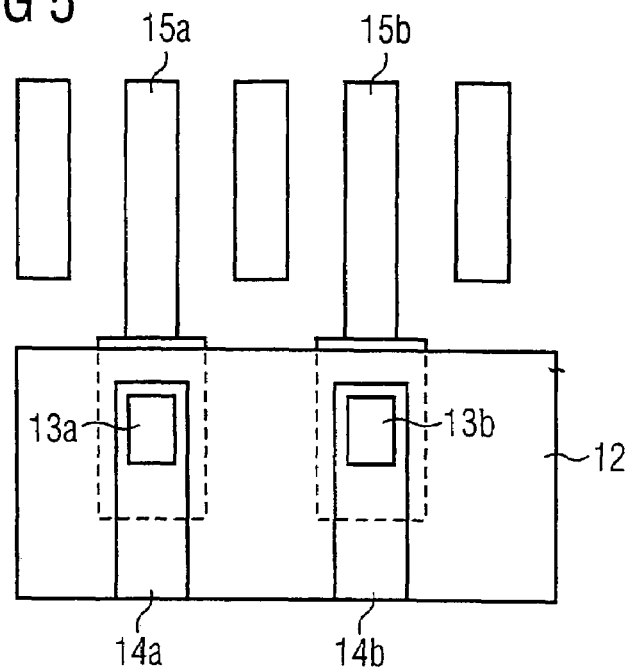
FIG. 5 shows a schematic plan view of a conventional semiconductor memory with word line segments issuing from a driver circuit.

FIG. 5 shows a detail from a driver circuit 12, which is connected to two interconnect segments 15a, 15b by two contact hole fillings 13a, 13b arranged below it. The illustration furthermore shows the three ends of three adjacent interconnect segments, which are contact-connected by a driver circuit arranged opposite. Leads 14a, 14b are provided within the driver circuit 12 and supply the contact hole fillings 13a, 13b with the word line potential of the respective word line. The main word lines (running above the plane of the drawing) of the word lines, which cross the driver circuit 12, are not illustrated.

Figure 6:
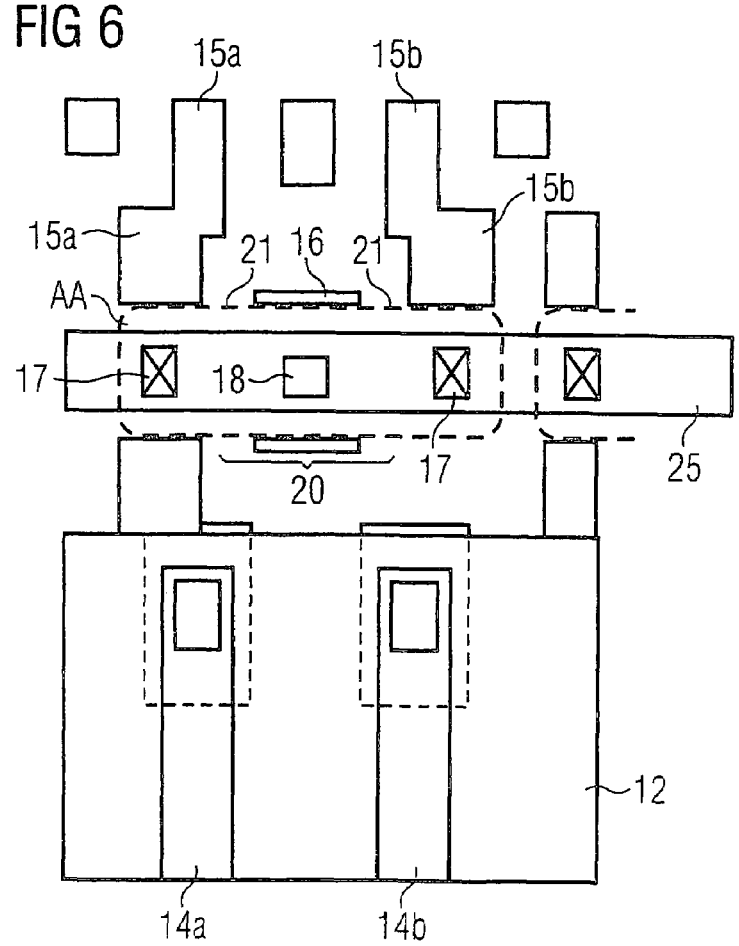
FIG. 6 shows a semiconductor memory according to the invention with word line segments issuing from a driver circuit and a switching unit according to the invention.

FIG. 6 shows a plan view—corresponding to FIG. 5—of a semiconductor memory which, however, is equipped with a short-circuiting transistor according to one embodiment of the invention, i.e., a switching unit 20 for short-circuiting two word lines. For this purpose, a gate electrode 16 is arranged between the interconnect segments 15a and 15b, the gate electrode being surrounded in an active area AA, which is depicted with a dashed border and extends from the word line segment 15a as far as the word line segment 15b. Two source/drain implantations 21 extending over the area region between a respective word line segment 15a, 15b and the gate electrode 16 are in each case introduced into the active area AA. The interconnect segments 15a, 15b are connected to the substrate through contact holes in a gate oxide layer, which are designated by 17, and thereby also to the adjacent source/drain implantations 21. The gate electrode 16 is arranged between the latter, the gate electrode being connected to a control line 25 from above through a contact hole filling 18 and serving for switching the switching unit 20 and mutually short-circuiting the interconnect segments 15a and 15b. With the aid of the switching unit 20, an electrical potential fed to the interconnect segment 15a via a left-hand word line can be connected to a potential fed to the right-hand interconnect segment 15b, as a result of which a current is generated via the short-circuiting transistor 20 provided that all the contact hole fillings between one of the two interconnect segments 15a, 15b and the main word lines (not illustrated) respectively running thereabove are at low resistance. As soon as one of these resistances is at or has acquired high resistance, no current flows, which can be utilized for identifying a functional error of the memory.

Figure 7:
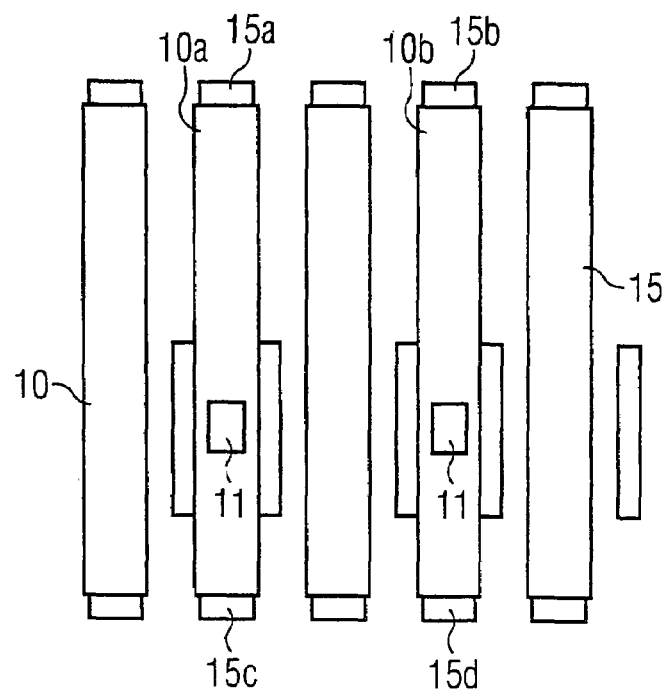
FIG. 7 shows a schematic plan view of a conventional semiconductor memory with word line segments.

FIG. 7 shows a view of a further conventional memory circuit corresponding to FIG. 5, no driver circuit being provided in this memory circuit. Instead, in a memory cell array, regions are provided in which, in the case of every second word line, main word lines 10a, 10b located at a higher level, which in FIG. 7 are illustrated somewhat wider than the interconnect segments 15a, 15b made of polysilicon, connect the interconnect segments 15a, 15b via contact hole fillings 11. The interconnect segments 15a, 15b are slightly widened below the contact hole fillings 11 in order to increase the contact-connecting reliability. The segment ends of the interconnect segments of the word lines located in between are cut out or shortened there, as indicated by the contours illustrated in dashed fashion below the middle and the two outermost main word lines 10.

Figure 8:
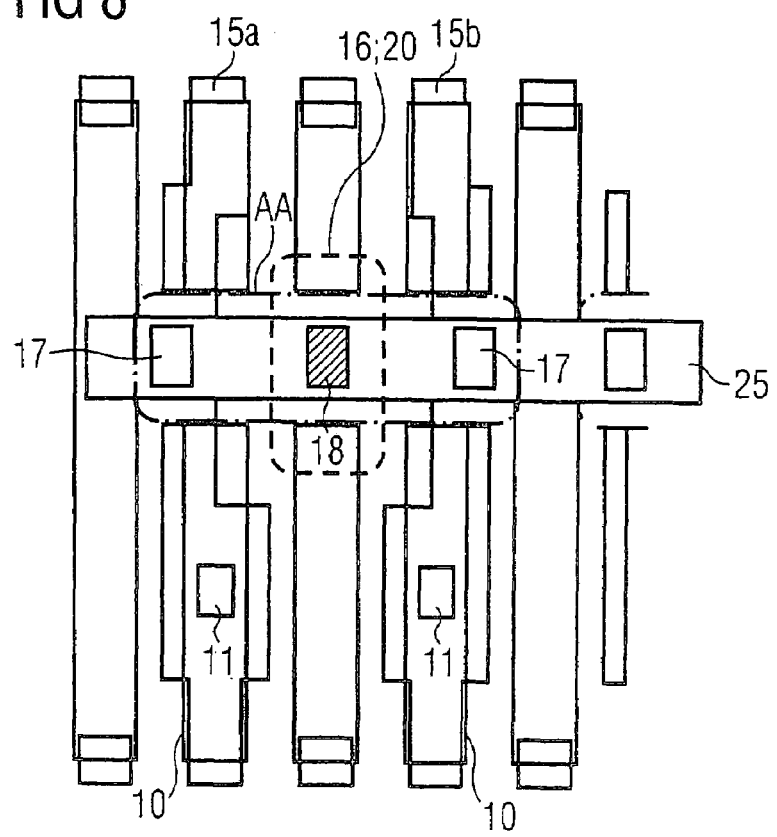
FIG. 8 shows a semiconductor memory according to the invention with word line segments.

In accordance with FIG. 8, in the case of such a semiconductor memory which is developed according to the invention, provision is made of a switching unit 20 in the form of a short-circuiting transistor 20, which is formed, in the plane of the drawing of FIG. 8, above the contact hole fillings 11 and laterally offset with respect thereto in the region of the word line located in between. It electrically connects the interconnect segments 15a, 15b to one another, which are connected to the respective main word lines 10 via the contact hole fillings 11. The course of the interconnect segments 15a, 15b, if it is concealed by the somewhat wider main word lines 10 located at a higher level, is illustrated in the form of solid lines in FIG. 8. Contact holes 17 issuing from the two interconnect segments 15a, 15b connect these interconnect segments to the outer regions of an active area AA extending between the two interconnect segments 15a, 15b right under a centrally located gate electrode 16 of the switching unit 20. A short-circuiting transistor 20 is formed in this way, the gate electrode 16 of which is connected to a control line 25 via a contact hole filling 18. If the short-circuiting transistor 20 is switched into a conducting state by means of the potential of the lead 25 and the gate electrode 16, the interconnect segments 15a, 15b located in the polysilicon plane can be used for electrically short-circuiting the two next but one adjacent main word lines 10. In this case, a current flow arises that passes via all the contact hole fillings between the main word lines and the interconnect segments 15a, 15b of the two word lines and presupposes that each of the contact hole fillings is at low resistance. As soon as one of the contact hole fillings is at high resistance, no current or only a small current flows, in which case a contact hole that has acquired high resistance and is therefore defective and leads to errors during later operation of the semiconductor memory is detected.

Figure 9:
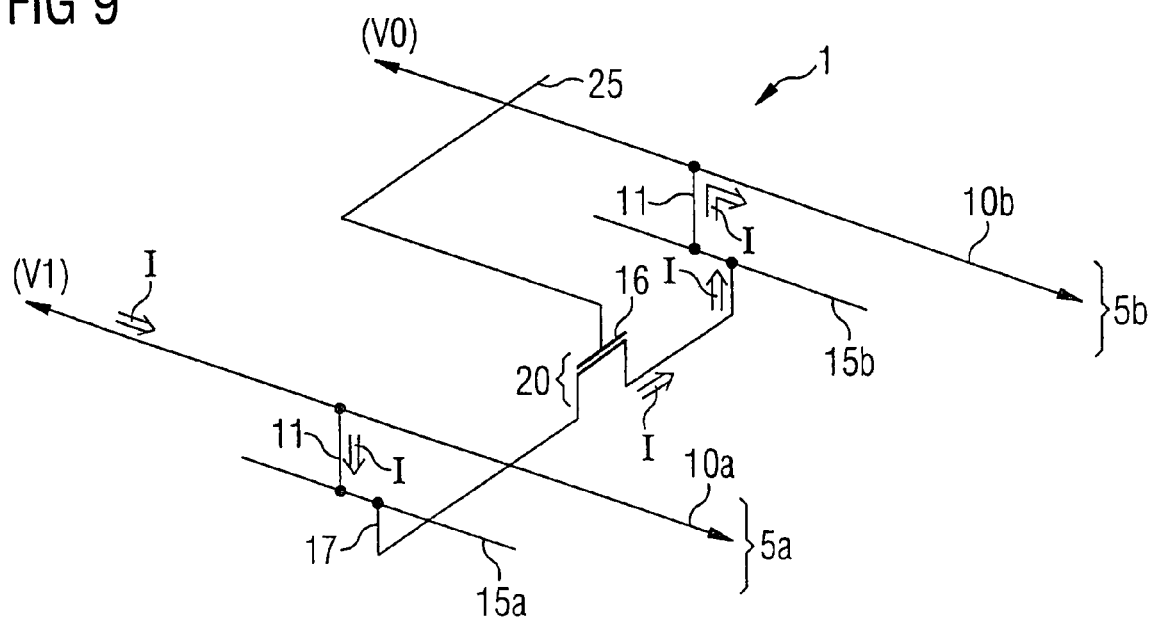
FIG. 9 shows a perspective-schematic illustration of the course of a short-circuit current in a semiconductor circuit according to the invention in accordance with FIG. 6 or 8.

The plan view illustrated in FIG. 8 is additionally illustrated in a schematic perspective view for the sake of clarity in FIG. 9, the perspective view illustrating in particular the current flow of a preferably static current I between a first word line 5a and a second word line 5b. The main word lines 10a, 10b of the word lines, which run in an upper interconnect plane, are illustrated with arrows at both ends in order to indicate that they extend still further than illustrated in their respective longitudinal direction. The two interconnect segments 15a, 15b are illustrated without arrows at their ends since they only run over a very limited length section. They are in each case connected to the main word lines 10a, 10b located at a higher level through contact hole fillings 11 and are electrically connected downwardly through further contact holes 17 to the material of the semiconductor substrate. An active area AA, which is illustrated in FIG. 8, is arranged in the semiconductor material precisely between the two word lines, the short-circuiting transistor provided according to the invention, i.e., the switching unit 20, being arranged in the center of the active area. The gate electrode 16 of the short-circuiting transistor 20 can be electrically driven via a control line 25 and, in the event of the short-circuiting transistor 20 being switched into a conducting state, leads to a current flow I along the direction of the double arrows.

Such a current brought about by a burn-in method can be obtained by the first word line 5a, by way of example, being electrically biased to a first potential V1 if the other, second word line 5b is simultaneously connected to a second potential V0. The current flows via the first main word line 10a, the contact hole filling 11 of the word line 5a, a section of the interconnect segment 15a, the contact hole 17, the active area of the short-circuiting transistor 20 to the second word line 5b, i.e., firstly to the interconnect segment 15b and from there via the contact hole filling 11 to the main word line 10b of the second word line 5b. The word line 5b is at the second potential V0; in the event of short-circuiting, a potential gradient arises and, consequently, a static current, which stresses all the contact hole fillings located in the current path significantly more rapidly and more efficiently than momentarily applied currents that are applied in conventional semiconductor circuits for the purpose of stressing. A preferred embodiment of the invention thus not only for the first time provides a first possibility for stressing contact holes of segmented word lines, but enables more efficient stressing compared with conventional burn-in methods by means of a static current flow since the current flowing via a short-circuiting transistor 20 is limited neither by the capacitance of the word line segments forming the gate electrodes nor by the word line voltage nor by the charge-reversal frequency for charge reversal of a word line segment.

Figure 10:
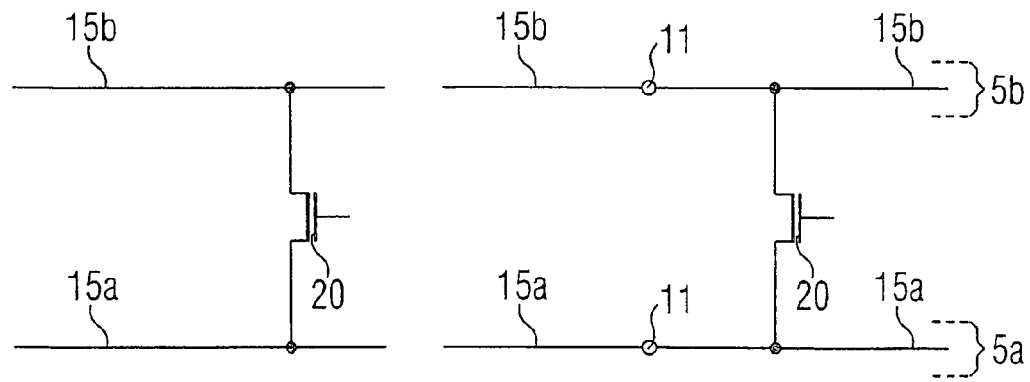
FIG. 10 shows a schematic illustration of the connection of word line segments with switching units according to the invention.

FIG. 10 shows a plan view of the arrangement of two word lines 5a, 5b illustrated in perspective in FIG. 9. These word lines are illustrated in FIG. 10 at the level of the word line segments 15a, 15b, which can in each case be short-circuited in pairs by means of switching units 20 according to an embodiment of the invention. A respective switching unit 20 can be used to produce the electrical connection between the two word lines in the region of the position of an arbitrary interconnect segment in order to stress the contact hole fillings present there.

Figure 11:
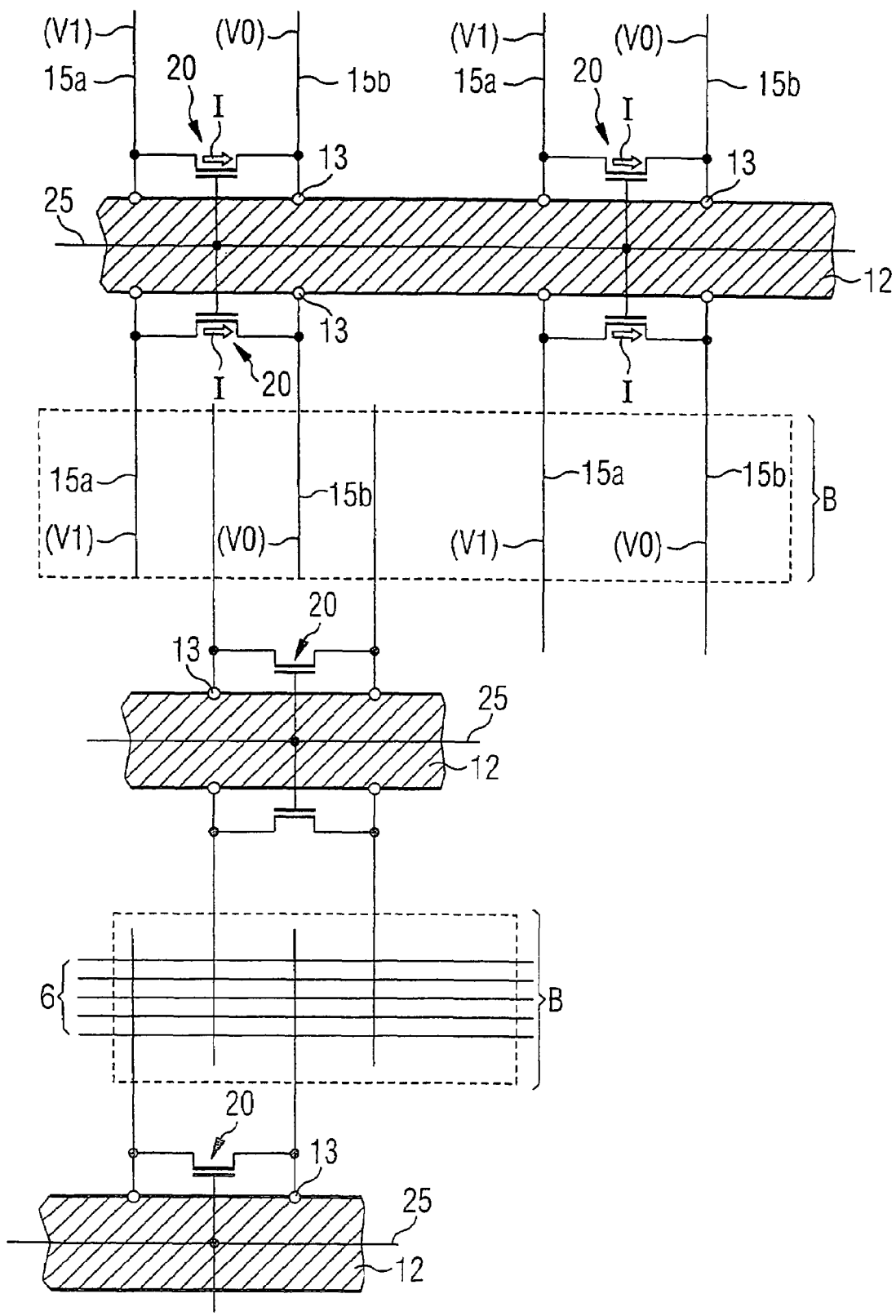
FIG. 11 shows a schematic plan view of a semiconductor memory according to the invention with control lines beside driver circuits.

FIG. 11 shows a schematic plan view of a semiconductor memory from FIG. 10 at the level of the interconnect segments 15 of the word lines. The cell array is subdivided into blocks B of memory cells between which driver circuits 12 for driving the word lines are arranged. Control lines 25, which can in each case drive a multiplicity of short-circuiting transistors 20 according to an embodiment of the invention, run within the area regions in which the driver circuits 12 are arranged. The control lines 25 run parallel to bit lines 6. Each short-circuiting transistor 20 short-circuits in each case the interconnect segments 15a, 15b of two word lines with one another. Since no memory cells are arranged in the region of the driver circuits 12, the control lines 25 and the switching units 20 according to the invention do not give rise to an appreciable loss of area. The interconnect segments 15a, 15b are connected to the main word lines, which run above the plane of the drawing, through the contact hole fillings 13. The illustration shows on the basis of the topmost control line 25 in FIG. 11 that a multiplicity of word lines 15a are simultaneously electrically biased with a first potential V1 and that in each case precisely one interconnect segment (15a) of each biased word line (5a) is short-circuited with in each case precisely one interconnect segment (15b) of a non-biased second word line (5b), which is connected to a second potential V0. Consequently, with the aid of a control line that runs in the region of the driver circuit 12 and is connected to a multiplicity of switching units, all word lines having interconnect segments 15a, 15b that are electrically connected to the driver circuit 12 are short-circuited with one another in pairs. In the event of short-circuiting with the aid of the short-circuiting transistors 20, the current I in each case flows from the first 15a to the second interconnect segment 15b when contact hole fillings are in tact.

FIG. 12 shows a plan view of a different embodiment of a semiconductor memory according to the invention, which semiconductor memory has no driver circuits. Instead, a plurality of blocks B of memory cell arrays are separated from one another only by the control lines 25 which drive the switching units 20 for short-circuiting adjacent word lines 5a, 5b. The contact hole fillings 13 connect the interconnect segments 15 to the main word lines above the plane of the drawing.

FIG. 13 shows a method according to the invention for stressing an integrated semiconductor memory. Any semiconductor memory that is described in one of the above-mentioned embodiments including the drawings can be stressed with this method. Firstly, a first potential V1 is applied to an active word line 5a, to be precise preferably over a relatively long time period from t=0 to t=T, where T corresponds to a multiplicity of clock times that is so large that the first potential V1 can be regarded as static.

Afterward, a switching unit 20 provided between an interconnect segment of the biased word line and an interconnect segment of the next but one word line is switched into a conductive state. This has the effect that, if the next but one word line is at a second potential V0, a static current flows between the two word lines. According to the invention, a current measurement is effected at one of the two word lines 5a, 5b. If the current measurement reveals that no or only a very small, insufficient current flow can be measured, this indicates that a defective contact hole filling is present and the semiconductor circuit has a defect in the region of one of the two word lines. In order to accelerate the burn-in test, a multiplicity of word lines can be simultaneously electrically biased and be short-circuited with a respective other word line that is not electrically biased, in order to increase the parallelism of the burn-in method with regard to the number of simultaneously stressed word lines. The possibilities for variation of the geometrical stress patterns result from the customary designs of memory cell arrays with application of the knowledge and abilities of the person skilled in the art. The time duration of the electrical stressing is also shortened by virtue of the fact that, according to the invention, a static current is used for stressing, which increases still further the efficiency of the artificial pre-aging of contact hole fillings within segmented word lines.

What is claimed is:

1. An integrated semiconductor memory comprising:
    a plurality of word lines, each word line having a main word line and a plurality of interconnect segments connected to the main word line, each interconnect segment being coupled to the respective main word line via at least one contact hole filling;
    a plurality of memory cells each including a selection transistor having a gate electrode coupled to a word line;
    at least one switching unit, by means of which an interconnect segment connected to a first main word line can be short-circuited with an interconnect segment connected to a second main word line; and
    a plurality of driver circuits, wherein the interconnect segments are coupled to the driver circuits and the driver circuits are coupled to the main word lines.

2. The semiconductor memory as claimed in claim 1, wherein the interconnect segments of two respective word lines can be short-circuited with one another in pairs by means of a respective switching unit.

3. The semiconductor memory as claimed in claim 1, wherein the interconnect segments of a respective word line can be short-circuited with interconnect segments of a respective next word line by means of the switching units.

4. The semiconductor memory as claimed in claim 1, and further comprising:
    a plurality of bit lines arranged within a plurality of blocks of memory cells; and
    a plurality of control lines running parallel to the bit lines and being provided between the blocks of memory cells, each control line being coupled to a plurality of switching units.

5. The semiconductor memory as claimed in claim 4, wherein a respective control line is arranged between adjacent blocks of memory cells.

6. The semiconductor memory as claimed in claim 1, wherein each switching unit comprises a short-circuiting transistor that includes two source/drain regions coupled to two interconnect segments of two word lines.

7. The semiconductor memory as claimed in claim 1, wherein two respective word lines can be short-circuited with one another in testwise fashion with the aid of control lines, a static current being conducted from the first main word line via at least one contact hole filling to a first interconnect segment, from the first interconnect segment via a short-circuiting-switched switching unit to the second interconnect segment, and from the second interconnect segment via at least one contact hole filling to the second main word line.

8. The semiconductor memory as claimed in claim 1, wherein a respective active word line, in a region of an individual interconnect segment, can be short-circuited with a passive word line by means of switching elements.

9. The semiconductor memory as claimed in claim 1, wherein the interconnect segments comprise polysilicon and the main word lines comprise a metal having a higher conductivity than polysilicon.

10. The semiconductor memory as claimed in claim 7, wherein a magnitude of the static current is used to indicate a failure in the at least one contact hole filling.

11. The semiconductor memory as claimed in claim 7, wherein a magnitude of the static current is used to indicate a failure in the at least one contact hole filling during a burn-in test.

12. The semiconductor memory as claimed in claim 1, wherein the driver circuits are coupled to the main word lines by a respective contact hole filling and to an interconnect segment by a respective further contact hole filling.

13. The semiconductor memory as claimed in claim 1, wherein two respective interconnect segments of a word line are coupled to the same driver circuit.

14. The semiconductor memory as claimed in claim 1, wherein a driver circuit and a control line are each arranged between adjacent blocks of memory cells.

* * * * *